(12) United States Patent
Yu et al.

(10) Patent No.: US 6,703,286 B1
(45) Date of Patent: Mar. 9, 2004

(54) METAL BOND PAD FOR LOW-K INTER METAL DIELECTRIC

(75) Inventors: Chen-Hua Yu, Hsin-Chu (TW); Chung-Shi Liu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/354,854

(22) Filed: Jul. 29, 1999

(51) Int. Cl.[7] ................................................. H01L 21/76
(52) U.S. Cl. ........................ 438/401; 438/618; 438/690; 438/700; 257/780; 257/781; 257/786
(58) Field of Search ................................. 438/689, 690, 438/691, 700

(56) References Cited

U.S. PATENT DOCUMENTS

| | | | | |
|---|---|---|---|---|
| 4,977,440 A | * | 12/1990 | Stevens | 357/68 |
| 5,070,036 A | * | 12/1991 | Stevens | 437/190 |
| 5,149,674 A | | 9/1992 | Freeman, Jr. et al. | 437/195 |
| 5,225,372 A | * | 7/1993 | Savkar et al. | 437/190 |
| 5,266,522 A | | 11/1993 | DiGiacomo et al. | 437/192 |
| 5,424,651 A | * | 6/1995 | Green et al. | 324/754 |
| 5,426,072 A | * | 6/1995 | Finnila | 437/208 |
| 5,470,793 A | | 11/1995 | Kalnitsky | 437/195 |
| 5,508,230 A | * | 4/1996 | Anderson et al. | 257/712 |
| 5,700,735 A | | 12/1997 | Shiue et al. | 438/612 |
| 5,874,356 A | | 2/1999 | Chen et al. | 438/637 |

* cited by examiner

*Primary Examiner*—Robert Kunemund
*Assistant Examiner*—Duy-Vu Deo
(74) *Attorney, Agent, or Firm*—George O. Saile; Stephen B. Ackerman

(57) ABSTRACT

A method is provided whereby successive layers of bond pads can be created. A pattern is created in the preceding level of metal bond pad, a dielectric is deposited over this pattern, openings are created in the dielectric that match the pattern, an opening is created above this pattern and metal is deposited inside this opening creating a square metal bond pad that is joined to the pattern that has been created in the metal of the preceding bond pad.

7 Claims, 3 Drawing Sheets

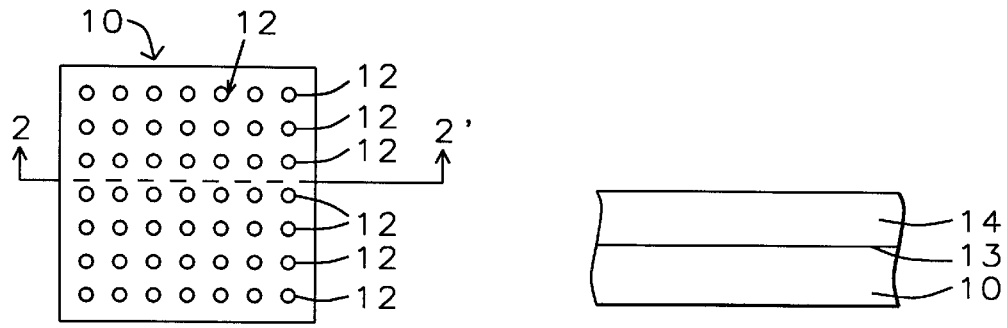
FIG. 1a – Prior Art
FIG. 1b – Prior Art
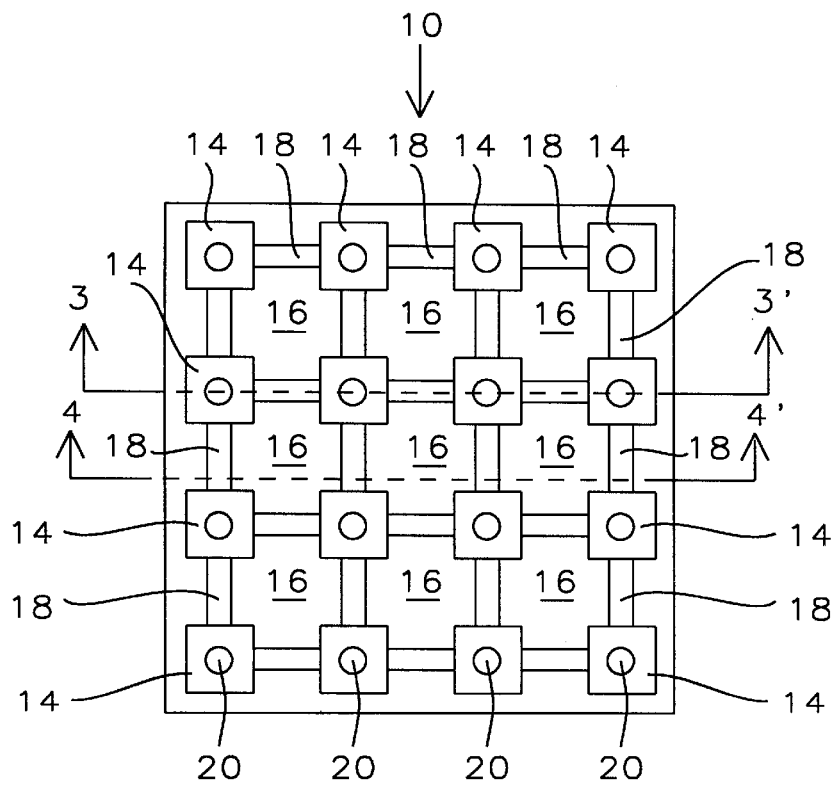
FIG. 2a

METAL BOND PAD FOR LOW-K INTER METAL DIELECTRIC

BACKGROUND OF THE INVENTION (1) Field of the Invention

The invention relates to the fabrication of integrated circuit devices, and more particularly, to a novel method of creating a metal bond pad for low-k Inter-Metal Dielectric.

(2) Description of the Prior Art

The continuation of increased demands for semiconductor circuit performance brings with it a continuation of increased demands for smaller device features and increased circuit packaging densities.

High density interconnect technology addresses the field of increased circuit packaging density where many integrated circuit chips are physically and electrically connected to a single substrate commonly referred to as a multi-chip module (MCM). To achieve a high wiring and packing density, it is necessary to fabricate a multilayer structure on the substrate to connect integrated circuits to one another. Typically, layers of a dielectric such as a polyimide separate metal power and ground planes in the substrate. Embedded in other dielectric layers are metal conductor lines with vias (holes) providing electrical connections between signal lines or to the metal power and ground planes. Adjacent layers are ordinarily formed so that the primary signal propagation directions are orthogonal to each other.

For many of the advanced semiconductor devices, device signals such as ground, power and I/O signals require numerous bonding pads. With the increased density of components within a chip and with increased sophistication of the circuitry contained within the chip, further demands are placed on the number of bonding pads for each chip. For many designs, the number of bonding pads becomes the limiting factor on chip size and chip function.

Improvements in packing density cannot be realized by simply shrinking the design rules or adding more levels of metal wiring.

Aluminum grows a passivating oxide layer in air and is as a consequence protected against corrosion. Aluminum wiring used in semiconductors, however, contains copper, which does not have a passivating oxide, and the Al—Cu alloy used is more vulnerable to corrosion. The corrosion of aluminum wires is caused by several sources such as chlorine transported through the plastic packaging and the passivation materials, chlorine from the etching compounds and as etching by-products, phosphorous acid formed from excess phosphorous in the phosphosilicate glass, etc. Only a small amount of chlorine is required to cause severe local corrosion of the aluminum lines. Aluminum corrosion can, in addition, occur very quickly after metal etching.

To avoid etching introduced corrosion, chlorine compounds and elemental chlorine must be removed from the metal surface immediately after plasma etching. A water rinse or a water vapor treatment usually accomplishes this.

Modern metal structures use multi-levels of dissimilar materials such as Ti/TiN/Al—Cu/TiN or Ti/Al—Cu/TiN, which increases the possibility of electromechanical corrosion.

Copper is electro-positive with respect to hydrogen and is not vulnerable to corrosion. However, in air copper oxide grows linearly with time, indicating the lack of a protective oxide. This lack of a passivating oxide makes copper more vulnerable to chemical corrosion. To avoid or minimize this corrosion, most applications of copper metalization involve some protective layer deposited on top of the copper.

In the production of high-density semiconductor devices, a primary concern of manufacturing is the creation of simple, reliable, and inexpensive bond pads is. Bond pads are disposed on a planar surface and provide a location for bonding wires or other connectors that are wired to device elements located in the semiconductor die substrate. The semiconductor die is in this manner wired to components external to the die. In one typical case, a bonding wire is attached to the bonding pad at one end and a portion of the lead frame at the other. Any improvement which simplifies the manufacturing process, enhances the reliability, or reduces the costs of bond pads can provide a competitive advantage to those involved in the commercial manufacture of semiconductor devices.

A typical application of a bond pad is where aluminum is exposed and used for the bond pad. A (gold) bonding wire can be bonded to this aluminum pad. Where ambient temperatures are relatively low, for instance less than approximately 150 degrees C., the physical attachment and the electrical connection between the gold wire and the aluminum pad remain sufficiently reliable. Where ambient temperatures increase above 150 degrees C., the bonding between the aluminum pad and the gold bonding wire rapidly degenerates. This is caused by the formation of gold and aluminum intermetallics that are caused by diffusion between the two metals resulting in the formation of aluminum-gold chemical compositions. Porosity, delamination, and voiding can now take place at the bonding interface. This effect is further emphasized by further increases in temperature over time resulting in the eventual failure of the interconnecting bond.

A basic requirement for bond pads is that they provide a maximum number of I/O interconnect locations. Intersection of wires that are used to make these I/O connections is thereby not desired (since these wires would now have to be electrically isolated further adding to the processing cost) which leads to an arrangement for the bond pads around the periphery of the final package. Materials used for the bond pads include metallic materials such as tungsten and aluminum while heavily doped polysilicon can also be used for contacting material. The bond pad is formed on the top surface of the semiconductor device whereby the electrically conducting material is frequently embedded in an insulating layer of dielectric. In using polysilicon as the bond pad material, polysilicon can be doped with an n-type dopant for contacting N-regions while it can be doped with p-type dopant for contacting P-regions. This approach of doping avoids interdiffusion of the dopants and dopant migration. It is clear that low contact resistance for the bond pad area is required while concerns of avoidance of moisture or chemical solvent absorption, thin film adhesion characteristics, delamination and cracking play an important part in the creation of bond pads. For these reasons extra steps, such as the creation of a metal seed layer and diffusion barrier layers (of Ti or TiN) within the openings created for the deposition of the bond pad, are often taken if metal (tungsten, aluminum) is used for the bond pad. These additional processing steps have various objectives such as improvement of adhesion of the deposited bond pad material, to serve as wetting layers to improve the flow of the metal into the bond pad cavity, the improvement of contact resistance and to form a diffusion barrier to avoid the migration of silicon (from the substrate) into the bond pad area.

The present invention relates generally to bond pads that are fabricated on a semiconductor die. More specifically, during formation of a bond pad, the shape of the bonding pad is altered where one (large) pad is divided into many (smaller) pads, the (smaller) pads that belong to the same interconnect level are interconnected. The new method avoids the presence of large amounts of the low-k IMD dielectric on the top surface of the pad since most of the IMD flows into the cavities between the (smaller) pad surfaces. Vias are created over the (smaller) pads thus enabling the typical bond pad interconnect function.

FIG. 1a shows a top view of a Prior Art bond pad arrangement 10 where in number of bond contact vias 12 have been created. FIG. 1b shows a cross section of the metal bond pad 10 over which a layer 14 of HSQ IMD has been deposited, the cross section is taken along the line 2–2' of FIG. 1a. HSQ/MSQ are typical low-k IMD's that are used for this application. These dielectric materials are prone to moisture absorption and the absorption of chemical solvents during device processing such as the creation of via patterns. This absorption can create problems of thin film adhesion ultimately affecting the reliability of the wire bond and the bonded semiconductor package. Low-k dielectric materials typically have low thermal conductivity making these materials more susceptible to dielectric cracking and delamination under and around the bond pad during the process of wire bonding. It must be noted from FIGS. 1a and 1b that the metal surface area of the bond pad is relatively large which makes the reduction of the absorbed moisture and solvents more difficult in the areas immediately adjacent to the bond pad. It must be noted from FIGS. 1a and b that the metal bond pad has one solid surface 13, FIG. 1b over which the IMD 14 is deposited. Via holes 12 (FIG. 1a) are created in the IMD 14 for electrical contact with the bond pad. It is the objective of the invention to reduce this relatively large surface area 13 of the bond pad.

U.S. Pat. No. 5,874,356 (Chen et al.) shows a zigzag pattern for a bond pad.

U.S. Pat. No. 5,700,735 (Shiue et al.) teaches a bond pad with diamond shaped vias.

U.S. Pat. No. 5,266,522 (Digiacomo et al.) shows a pad structure.

U.S. Pat. No. 5,149,674 (Freeman, Jr. et al.) teaches a multi-layer-bonding pad.

U.S. Pat. No. 5,470,793 (Kalmitsky) shows a bond pad process.

SUMMARY OF THE INVENTION

A principle objective of the invention is to improve bond pad reliability.

Another objective of the invention is to reduce absorption of moisture and chemical solvents by the Inter Metal Dielectric (IMD) during and after bond pad formation.

Yet another objective of the invention is to reduce thin film adhesion problems associated with bond pad creation.

A still further objective of the invention is to eliminate IMD delamination and cracking in the vicinity of the bond pad during the bond pad wire bonding operation.

A further objective of the invention is to improve the reduction of moisture and chemical solvent in the IMD.

A further objective of the invention is to allow for increased thermal expansion of the bond pad during high temperature device packaging operations.

In accordance with the objectives of the invention a new method is provided for the fabrication of bond pads on a semiconductor die. The shape of the Prior Art bond pad is altered where one (large) pad is divided into many (smaller) pads, the (smaller) pads that belong to the same interconnect level and that are part of one metal bond pad are interconnected. A dielectric is deposited over the pattern of (smaller) pads, openings are made in the dielectric that match the patterns of smaller pads. A square opening is created overlying the created smaller pads and filled with metal joining the newly created square metal bond pad with the preceding patterns of small metal pads.

The new method avoids the presence of large amounts of the low-k IMD dielectric on the top surface of the pad since most of the IMD flows into the cavities between the (smaller) pad surfaces. Vias are created over the (smaller) pads thus enabling the typical bond pad interconnect function.

BRIEF DESCRIPTION OF THE DRAWINGS

FIGS. 1a and 1b show a Prior Art bond pad.

FIGS. 2a, 2b and 2c show a bond pad of the invention.

FIG. 3 shows a cross section of an array of contacts under a layer of bond pad metal.

DESCRIPTION OF THE PREFERRED EMBODIMENTS

Figure 2B:
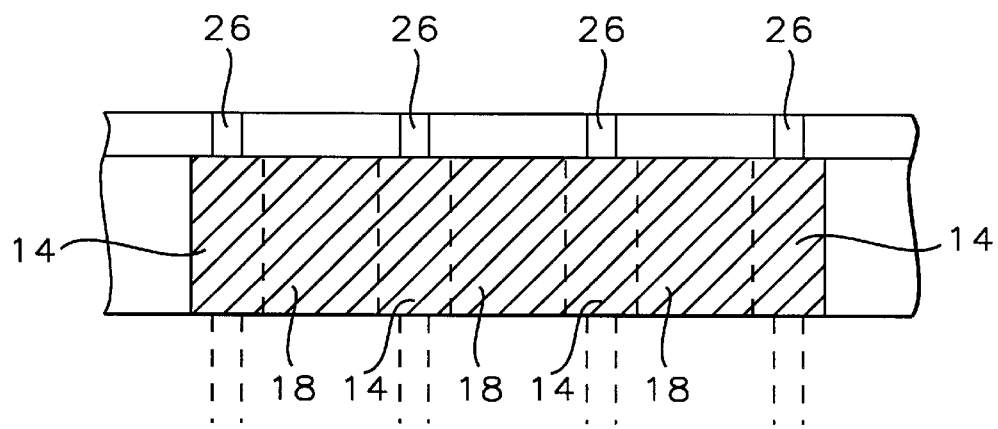

Referring now specifically to FIG. 2a, there is shown a top view of the bond pad 10 of the invention. The metal pad (10, FIGS. 1a and 1b) of the bond pad is fundamentally altered in that the metal pad of the invention consists of a group of small inter-connected contact pads 14. The invention teaches the re-layout of the shape of the bond pad. The relatively large bond pad is divided into many small sections (hereafter referred to as bond-pad contact pads or more briefly as contact pads) whereby all the newly created bond-pad contact pads of the bond pad interconnected (by means of bond-pad interconnects) to the adjacent bond-pad contact pads (within the same bond pad). In FIG. 2a, the small bond-pad contact pads 14 are interconnected by means of pad interconnects 18 that run in both the X and the Y-direction of the bond pad 10. The re-layout of the bond pad has been achieved by removing metal from the areas highlighted with 16. The Inter Metal Level Dielectric (IMD) is deposited over the surface of the bond-pad, via openings 20 are created in the IMD for electrical contact with the bond pad 10.

It must further be understood that the top surface of each of the small bond-pad contact pads 14 falls in the same plane as the top surface of the metal interconnects 18 that are left in place between the small pads 14. By creating the openings 16 within the bond pad 10 that are not occupied by either the small contact pads 14 or the metal interconnects 18, the invention provides the means to deposit the ILD,such that the ILD can flow into these openings 16 thereby leaving only a small amount of ILD overlying the small contact pads 14 and the metal interconnects 18. This is further shown in the following two cross sections.

FIG. 2b shows a cross section of the bond pad of the invention; this cross section is taken along line 3–3' of FIG.

2a. The areas highlighted with 18 are, as in FIG. 2a, the interconnects between the small contact pads 14. In the cross section that is shown in FIG. 2b (a cross section that is taken along line 3–3' of FIG. 2a), the lower section 14/18 is uninterrupted metal with the same top plane and the same bottom plane.

Figure 2C:
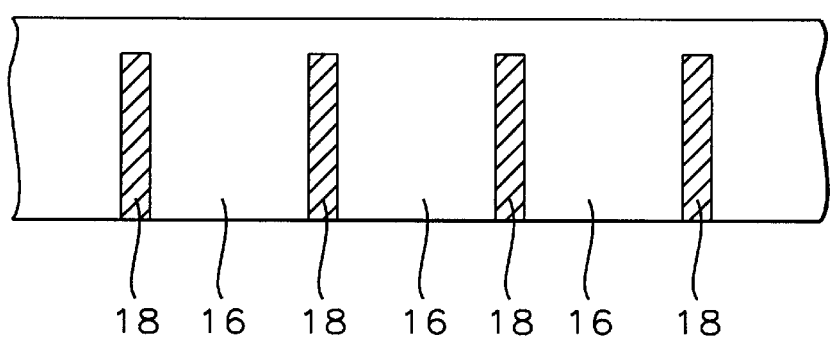

FIG. 2c shows a cross section of FIG. 2a taken along the line 4–4' of FIG. 2a. From the cross section it is clear that a significant amount of space 16 has been opened up between the small contact pads 14 within the bond pad 10. The metal interconnects 18 that are provided in Y-direction of the bond pad are clearly shown in cross section while the openings 16 that are provided in between the small contact pads 14 are also clearly visible in the cross section of FIG. 2c. Metal interconnects 18 are also provided in the X-direction of the bond-pad 10 as shown in FIG. 2a.

It is clear from FIG. 2c that the IMD that is deposited over the bond-pad will first fill openings 16 after which the IMD will overlay the areas on the top surface of the metal contact pads 14 and the metal interconnects 18. This results in a considerable reduction of the IMD that overlies the contact pads 14 of the bond pad 10 thereby sharply reducing the above highlighted problems of Prior Art bond pad formation such as IMD delamination and cracking. Vias 26 (FIG. 2b) are opened above the metal contact pads 14 and provide the means for making electrical contact with the bond pad 10.

Figure 3:
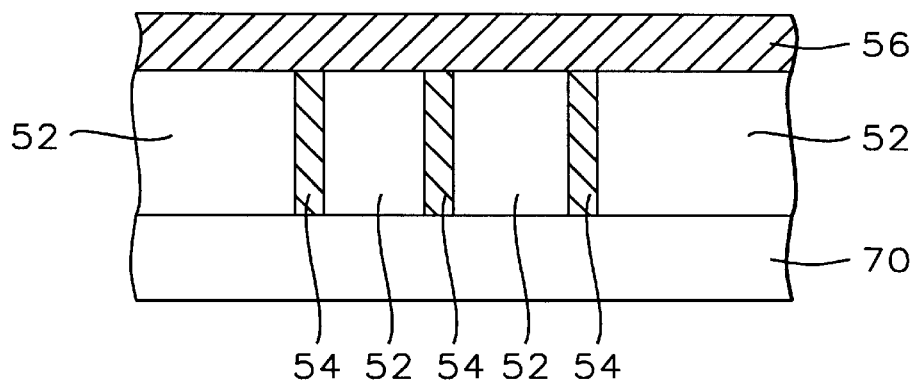
FIGS. 3 though 6 show the creation of a bond pad of the invention with a second layer of metal, as follows.

FIG. 3 shows a cross section of an array of contacts 54 under a layer 56 of bond-pad metal. In the Prior Art, bond pads and integrated circuits are interconnected by using multi-layer metal bond pads, sequential layers of metal are patterned and isolated from each other by successive layers of dielectric. In this Prior Art process, the first level of metal is deposited and patterned forming bond pads in the periphery of the device after, which the bond pads are connected to the integrated circuit by metal lines. A second metal layer is then deposited and patterned in such a manner that the second bond pads are above and in line with the pattern of first bond pads. This sequence of depositing and patterning bond pads can be continued until the desired number of metal layers has been achieved, thereby forming a multi-layer bond pad arrangement. Typically, the bond pad area of the metal layers are patterned into rectangular pads with the overlying layer of dielectric being patterned with a large rectangular opening that aligns with the bond pads. The opening created in the dielectric through which the bond pads are to be contacted can also consist of multiple openings. The invention teaches the etching of the metal layer of the bond pad such that the surface of the bond pad contains multiple pads to form the bond pad. The IMD can then be deposited over the surface of the multiple pads of the bond pad in this manner again creating interconnecting metal layers that meet the overall package design objectives.

Typical dimensions for the bond pad are 100×100 um, these dimensions are not affected by the invention.

Figure 4:
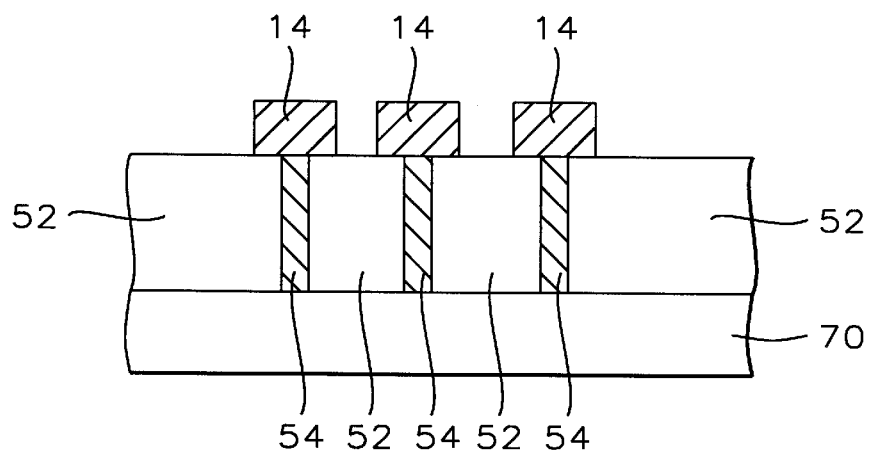
FIG. 4 shows the cross section of the array of contacts with the sub-division of the bond pad metal into a multiplicity of small sections.

FIG. 4 shows how the process of the invention is started with a substrate 70 on the surface of which is formed a pattern of metal contact points 56 within the layer 52 of Intra Level Dielectric (ILD). The metal contact points 54 are to make contact with points of electrical interconnect that are provided in the surface of substrate 70. A layer 56 of metal for the bond pad is deposited over the surface of the metal contact points 54 and over the surface of the layer 52 of ILD that separates the contact points 54.

FIG. 4 shows a cross section of the formation of the bond pad of the invention after the metal layer 56 (FIG. 3) has been patterned to form individual contact pads 14. Typical, state of the art procedures and processes can be used for this patterning of layer 54 (FIG. 3).

Figure 5:
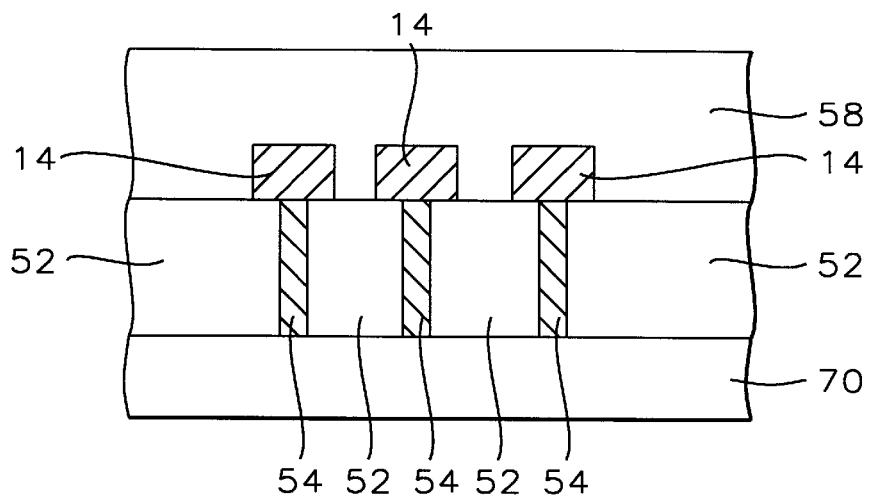
FIG. 5 shows the cross section of FIG. 4 after the deposition of a layer of Inter Metal Dielectric (IMD) over the pattern created as shown in FIG. 4.

FIG. 5 shows the cross section of the bond pad of the invention after a layer 58 of Inter Metal dielectric (IMD) has been deposited over the surface of the formed small pads 14 and the layer of ILD 52. It is clear that, due to the profile of the cavity 16 (FIG. 2a) into which the IMD is deposited, that the invention provides a method that allows a large amount of the deposited IMD to flow into the cavity 16 between the contact pads 14 and the interconnects 18 leaving only a small amount of the IMD on the top surface of the contact pads 14 and the interconnects 18.

Figure 6:
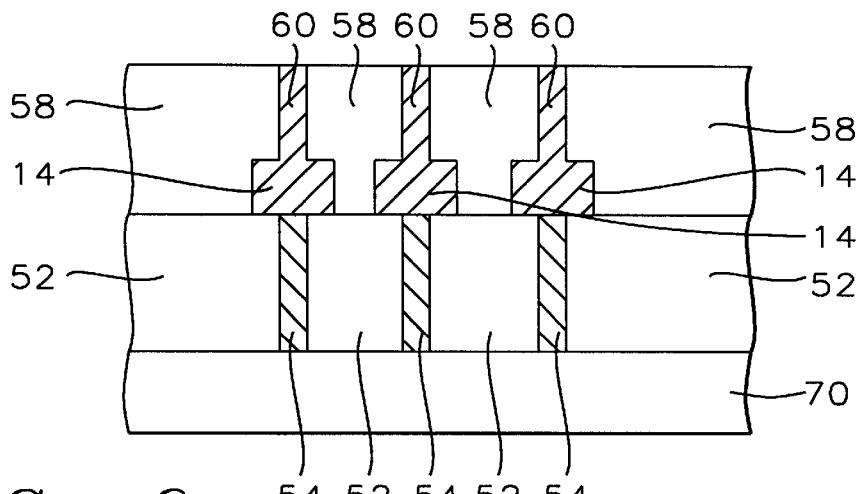
FIG. 6 shows the cross section of FIG. 5 after via holes have been created in the layer of IMD.

The method of the invention results in the following advantages:

elimination of the delamination problem that typically occurs during the chip bonding process improved adhesion of the bond pad to surrounding packaging material due to the bond pad surface topography the small contact pad can undergo increased thermal expansion during semiconductor device packaging FIG. 6 shows a cross section of the bond pad after the via openings 60 to the small contact pads 14 have been created in the layer of IMD 58. The creation of via openings 60 is the final step under the process of the invention and allows the establishment of electrical contact between the (top surface of) the bond pad and the points of electrical contact provided in the surface of the substrate 70.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method of forming a first level bond pad, comprising the steps of:

providing a pre-processed semiconductor substrate having active elements in or on its surface, said active elements having points of electrical contact in or on the surface of said substrate, furthermore bond pads have been created on the surface of said substrate, said bond pads having a height in a direction that is perpendicular to the surface of said substrate, further having a cross section in a plane that is parallel with a plane of the surface of said substrate, said cross section being a geometric square or rectangle, said cross section having a surface area;

etching said bond pads creating cavities in said bond pads, providing intra bond-pad contact points, furthermore providing intra bond-pad interconnects, said intra-bond contact points having a height that is equal to said height of said bond pads, further having a cross section in a plane that is parallel with a plane of the surface of said substrate, said cross section of said intra-bond contact points being a geometric square or rectangle, said cross section of said intra-bond contact points having a surface area that is smaller than said surface area of said cross section of said bond pads by a measurable amount, said intra-bond pad interconnects having a height in a direction that is perpendicular to the surface of said substrate that equals said height of said intra-bond contact points, said intra-bond pad interconnects establishing electrical interconnects between adjacent intra-bond contact points in an X and an Y direction;

depositing a layer of dielectric over said etched bond pads, filling said cavities created in said bond pads, said layer of dielectric further overlying the surface of said intra-bond contact points and said intra bond-pad interconnects;

creating contact openings in said layer of dielectric, said openings being aligned with the surface of said intra-bond contact points; and depositing and planarizing a layer of metal over said layer of dielectric, including said openings created in said layer of dielectric that align with said intra bond-pad contact points, forming said first level bond pad overlying said intra bond-pad contact points.

2. The method of claim 1 thereby furthermore forming a sequence of levels of metal bond-pads, each sequence to start with a preceding level of metal bond pad that is contained in a surrounding dielectric, said sequence comprising:

forming a pattern of metal pads in each of said preceding metal bond pads, said square metal pads to be electrically interconnected;

depositing a dielectric layer over said surrounding dielectric, including said preceding metal bond pads;

forming a first pattern of openings in said dielectric layer, said first pattern of openings to align with said pattern of metal pads in each of said preceding metal bond pads;

forming a second pattern of openings that align with said first pattern of openings; and filling said first pattern of openings and said second pattern of openings with a layer of metal, forming a next level of metal bond pads.

3. The method of claim 2 whereby said sequence of levels of metal bonds extend to one level below the top-level metal bond.

4. A method of forming a first level bond pad, comprising the steps of:

providing a pre-processed semiconductor substrate having active elements with points of electrical contact in its surface;

depositing a first layer of dielectric over the surface of said substrate;

etching contact openings in said first layer of dielectric, said openings to align with said points of electrical contact provided in the surface of said substrate;

depositing a first layer of metal over the surface of said first layer of dielectric, including said contact openings in said first layer of dielectric;

patterning and etching said layer of metal thereby leaving said contact openings in tact thereby creating a pattern of bond pads overlying said first layer of dielectric;

depositing a second layer of dielectric over said patterned bond pads;

etching openings in said second layer of dielectric, said openings in said second layer of dielectric to align with said patterned bond pads overlying said first layer of dielectric;

depositing a second layer of metal on the surface of said second layer of dielectric thereby including said etched openings in said second layer of dielectric; and patterning said second layer of metal whereby said pattern of said second layer of metal aligns with said bond pad pattern overlying said first layer of dielectric.

5. The method of claim 4 wherein said patterning and etching said bond pads is removing metal from said bond pads, creating cavities into which dielectric deposited over said bond pads penetrates, creating a multiplicity of individual intra bond-pad contact points that are interconnected with metal.

6. The method of claim 4 thereby furthermore forming a sequence of levels of metal bond-pads, each sequence to start with a preceding level of metal bond pad that is contained in a surrounding dielectric, said sequence comprising:

forming a pattern of metal pads in each preceding metal bond pad, said metal pads to be electrically interconnected;

depositing a dielectric layer over said surrounding dielectric, including said preceding metal bond pad;

forming openings in said dielectric layer said openings to align with said pattern of metal pads in said preceding metal bond pad; forming a pattern of metal pads that align with said openings; and filling said metal pads that align with said openings with a layer of metal thereby forming a next level of metal bond pads.

7. The method of claim 6 whereby said sequence of levels of metal bonds extend to one level below the top-level metal bond pad.

* * * * *